(12) United States Patent
Tatsuta

(10) Patent No.: US 6,411,342 B1
(45) Date of Patent: *Jun. 25, 2002

(54) VIDEO SIGNAL TRANSMISSION EQUIPMENT

(75) Inventor: Akihiro Tatsuta, Kashiwara (JP)

(73) Assignee: Matsushita Electric Industrial Co., Ltd., Osaka-fu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/016,837

(22) Filed: Feb. 2, 1998

(30) Foreign Application Priority Data

Feb. 5, 1997 (JP) ............................................. 9-022698

(51) Int. Cl.⁷ ................................................ H04N 5/38
(52) U.S. Cl. ....................... 348/724; 348/723; 348/726; 348/675; 348/388.1; 348/536; 348/537
(58) Field of Search ................................. 348/723, 724, 348/725, 726, 6, 7, 475, 388, 536, 537; 455/112, 113, 118, 108–109, 123, 120; H04N 5/38

(56) References Cited

U.S. PATENT DOCUMENTS

| | | | | |
|---|---|---|---|---|
| 2,593,395 A | * | 4/1952 | Sziklai | 455/112 |
| 3,375,444 A | | 3/1968 | Lomer | |
| 4,434,440 A | * | 2/1984 | Schiff | 348/723 |
| 4,475,242 A | * | 10/1984 | Rafal et al. | 455/3 |
| 4,504,861 A | * | 3/1985 | Dougherty | 348/723 |
| 4,511,864 A | | 4/1985 | Riviéré | 332/151 |
| 4,564,858 A | * | 1/1986 | Resch | 348/723 |
| 4,622,694 A | * | 11/1986 | Weber et al. | 455/47 |
| 4,745,493 A | * | 5/1988 | Gedl et al. | 348/723 |
| 4,794,458 A | | 12/1988 | Nagatomi | 348/724 |
| 5,130,802 A | * | 7/1992 | Ruprech et al. | 348/726 |
| 5,172,231 A | * | 12/1992 | Jarick et al. | 348/723 |
| 5,243,304 A | * | 9/1993 | Rixon | 332/170 |
| 5,307,382 A | | 4/1994 | Pang | 375/376 |
| 5,534,914 A | * | 7/1996 | Flohr et al. | 348/15 |
| 5,825,242 A | * | 10/1998 | Prodan et al. | 348/726 |
| 5,886,752 A | * | 3/1999 | Cross | 348/724 |
| 5,909,253 A | * | 6/1999 | Jonnalagadda et al. | 348/608 |

FOREIGN PATENT DOCUMENTS

| | | | | |
|---|---|---|---|---|
| JP | 3548085 | * | 12/1970 | 348/723 |
| JP | 02202726 A | | 8/1990 | |
| JP | 02 202726 A | | 8/1990 | |

OTHER PUBLICATIONS

K. Blair Benson, Television Engineering Handbook featuring HDTV systems, McGraw–Hill, Inc., pp. 4.29, 21.6–21.7, 1992.*

* cited by examiner

Primary Examiner—John W. Miller
Assistant Examiner—Linus H. Lo
(74) Attorney, Agent, or Firm—Akin, Gump, Strauss, Hauer & Feld, L.L.P.

(57) ABSTRACT

A signal of a vestigial sideband modulated wave is generated by use of a first oscillator, an amplitude-modulator and a surface acoustic wave filter for vestigial sideband filtering at a frequency being higher than the carrier frequency of a video signal, the signal is frequency-converted to a given transmission channel by use of a first PLL frequency synthesizer, a first control circuit, a frequency converter and a filter.

3 Claims, 9 Drawing Sheets

VIDEO SIGNAL TRANSMISSION EQUIPMENT

BACKGROUND OF THE INVENTION

The present invention relates to a video signal transmission equipment for transmitting a video signal of a vestigial sideband modulated wave in a wire system or a wireless system.

A conventional video signal transmission equipment is described in Japanese Laid-open Patent Application No. Hei 2-202726, and this equipment will be described with reference to FIG. 6 to FIG. 9.

FIG. 6 is a block diagram showing the configuration of the conventional video signal transmission equipment. In the figure, the video signal transmission equipment comprises an input device 31 to which a video signal is input, and the output terminal of the input device 31 is connected to on input terminal of a VHF modulation circuit 33. To the other input terminal of the VHF modulation circuit 33, the output terminal of a carrier oscillation circuit 32 is connected and a carrier wave of a frequency $f_p$ is input. The output terminal of the VHF modulation circuit 33 is connected to the input terminal of a VHF surface acoustic wave filter 34 for vestigial sideband filtering (hereinafter, abbreviated as VSBF 34). The output terminal of the VSBF 34 is connected to the input terminal of an amplifying circuit 35, and a video output signal is obtained from the output terminal of the amplifying circuit 35. The VSBF 34 is a band pass filter having a frequency characteristic shown in FIG. 8.

The operation of the video signal transmission equipment configured above will be described hereafter.

The video input signal to the input device 31 is set to a predetermined level, and is output as an output signal. The output signal of the input device 31 is supplied to the VHF modulation circuit 33, and the carrier signal input from the carrier oscillation circuit 32 to the VHF modulation circuit 33 is amplitude-modulated. The frequency spectrum of the output signal of the VHF modulation circuit 33 is shown-in FIG. 7. Then, the output signal is applied to the VSBF 34. The frequency components of the upper sideband and a part of the lower sideband of the output signal pass through the VSBF 34, so that a modulated wave is obtained which has a vestigial sideband shown in FIG. 9. The output signal of the VSBF 34 is power-amplified by the amplifying circuit 35, and transmitted as the video output signal.

The above-described conventional video signal transmission equipment has problems shown below. Since the oscillation frequency $f_p$ of the carrier oscillation circuit 32 is fixed and the frequency characteristic of the VSBF 34 is also fixed and unchangeable, only a video signal for one transmission channel can be obtained. In order to change the transmission channel, it is necessary to change the oscillation frequency $f_p$ of the carrier oscillation circuit 32 and change the frequency characteristic of the VSBF 34. To handle plural transmission channels, it is necessary to prepare as many VSBFs 34 as the number of transmission channels. It has been necessary to change the circuit or replace a part in order to change the oscillation frequency $f_p$ and change the frequency characteristic of the VSBF 34.

BRIEF SUMMARY OF THE INVENTION

A first object of the present invention is to provide a video signal transmission equipment capable of transmitting a video signal on a specified channel of plural channels without changing the circuit or replacing a part.

A second object of the present invention is, in addition to the above-mentioned first object, to provide a video signal transmission equipment configured so that a video signal is not transmitted on a channel other than the specified channel.

A third object of the present invention is, in addition to the above-mentioned first object, to provide a video signal transmission equipment capable of transmitting a video signal on a predetermined auxiliary channel when the video signal of the specified channel cannot be transmitted.

To achieve the above-mentioned first object, a video signal transmission equipment in a first aspect of the present invention comprises: a first oscillator for outputting a sinusoidal signal of a frequency being higher than a carrier frequency of a video signal which is transmitted from the video signal transmission equipment; an amplitude-modulator for amplitude-modulating an output signal of the first oscillator by a video baseband signal; a first filter for filtering an output signal of the amplitude-modulator, and having a particular frequency characteristic; a second oscillator oscillating at a frequency range which is higher than an oscillation frequency of the first oscillator; control means for controlling an oscillation frequency of the second oscillator; a frequency converter for multiplying an output signal of the second oscillator and an output signal of the first filter; and a second filter for low-pass-filtering an output signal of the frequency converter.

According to the video signal transmission equipment in the first aspect, an effect is obtained that the video signal can be transmitted on a specified channel of plural channels without changing the circuit or replacing a part.

To achieve the second object, a video signal transmission equipment in a second aspect of the present invention comprises in the above-mentioned video signal transmission equipment: detecting means for detecting a condition of synchronism between the output signal of the second oscillation means and a reference clock signal; and inhibiting means for inhibiting transmission of a video signal from the second filter when the second oscillation means is unlocked.

According to the video signal transmission equipment in the second aspect, in addition of the effect of the first video signal transmission equipment, an effect is obtained that a video signal which becomes an interference signal for other channels is never transmitted when the second oscillation means is unlocked.

To achieve the third object, in video signal transmission equipment in a third aspect of the present invention, in the video signal transmission equipment In the first aspect, the oscillation frequency of the first oscillator is made variable, and the following are further provided: detecting means for detecting a condition of lock between the output signal of said second oscillator and a reference clock signal; and switching device for causing the output signal of said first filter to be directly transmitted on a predetermined channel when the output signal of said second oscillator and the reference clock signal are unlocked.

According to the video signal transmission equipment in the third aspect, in addition to the effect of the video signal transmission equipment in the first aspect, an effect is obtained that the video signal is transmitted on an auxiliary channel so that the video signal does not become an interference signal for other channels even when the output signal of the second oscillation means and the reference clock signal are unlocked.

DETAILED DESCRIPTION OF THE INVENTION

Hereafter, the video signal transmission equipment of each embodiment of the present invention will be described with reference to FIG. 1 to FIG. 5.

First Embodiment

Figure 1:
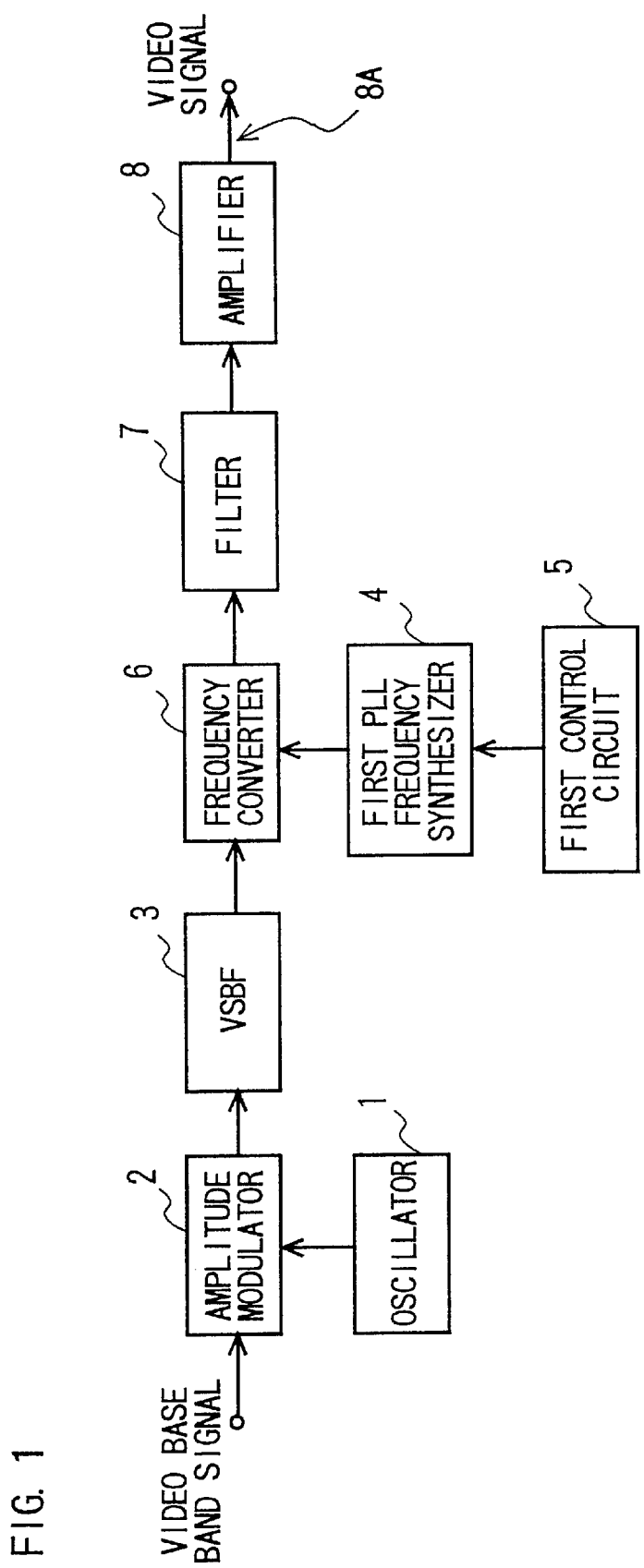
FIG. 1 is a block diagram showing the configuration of video signal transmission equipment of a first embodiment of the present invention.
Figure 2:
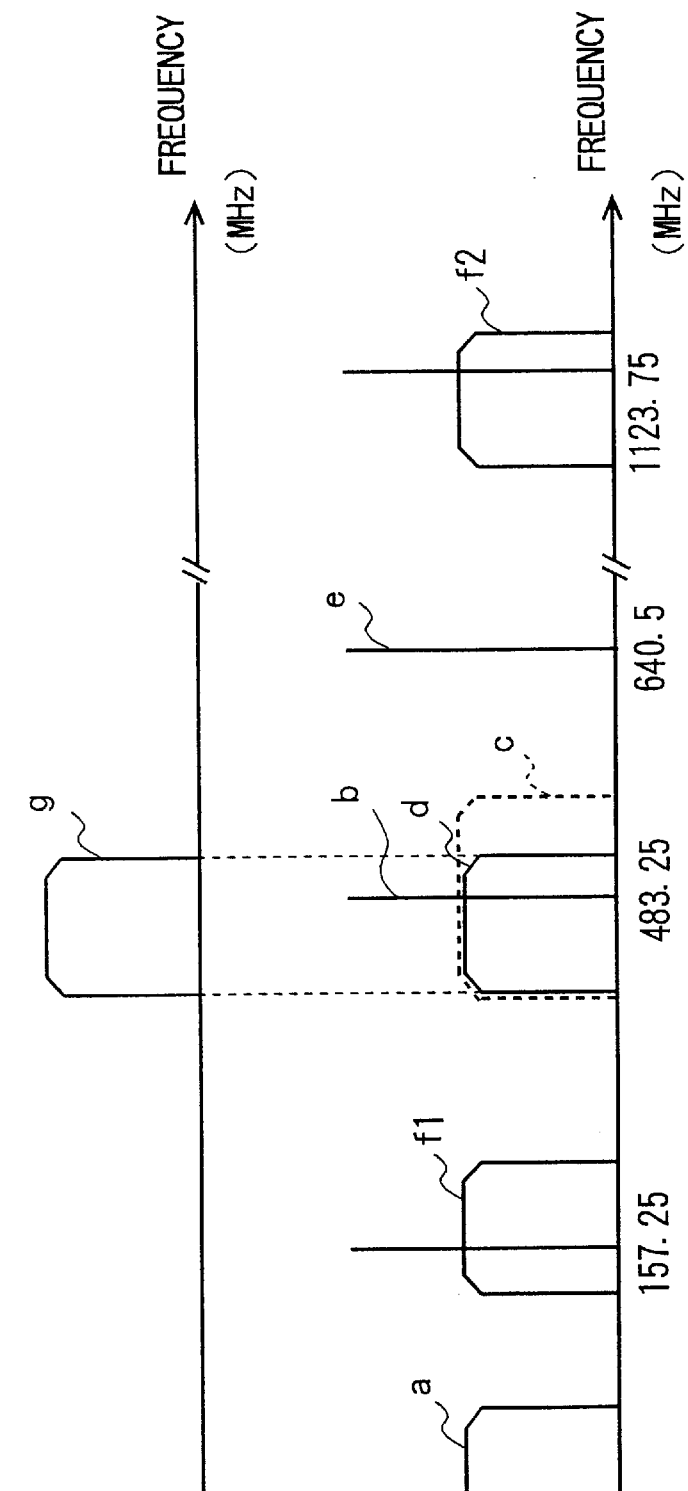
FIG. 2A and FIG. 2B are views showing the frequency band of each signal for explaining the operation in the video signal transmission equipment of FIG. 1.

The video signal transmission equipment in a first embodiment of the present invention will be described with reference to FIG. 1 and FIG. 2. In the video signal transmission equipment as an example in the first embodiment, the video carrier frequency is set at intervals of 6 MHz in the range of 157.25 MHz to 295.25 MHz and video signals of a total of 24 channels can be transmitted. FIG. 1 is a block diagram showing the configuration of the video signal transmission equipment in the first embodiment. FIG. 2 shows an example of the disposition of the frequency band of each signal; the lateral axis represents the frequency and the longitudinal axis represents the level.

In the figure, a video baseband signal is input to one input terminal of an amplitude-modulator 2. To the other input terminal of the amplitude-modulator 2, the output terminal of an oscillator 1 as a first oscillator is connected. The output terminal of the amplitude-modulator 2 is connected to the input terminal of a surface acoustic wave filter 3 for vestigial sideband filtering (hereinafter, abbreviated as VSBF 3). The output terminal of the VSBF 3 is connected to one input terminal of a frequency converter 6. The output terminal of the frequency converter 6 is connected to the Input terminal of a filter 7, and the output terminal of the filter 7 is connected to the input terminal of an amplifier 8. The output terminal of a first control circuit 5 is connected to the input terminal of a first PLL frequency synthesizer 4 as a second oscillator, and the output terminal of the first PLL frequency synthesizer 4 is connected to the other input terminal of the frequency converter 6.

The oscillator 1 outputs a sinusoidal signal of a frequency of 483.25 MHz which is higher than the carrier frequency (ranging from 157.25 MHz to 295.25 MHz) of a video signal 8A to be transmitted from the video signal transmission equipment. The amplitude-modulator 2 amplitude-modulates the sinusoidal signal of the oscillator 1 by the video baseband signal. The VSBF 3 is a band pass filter having a frequency characteristic shown by a figure g of FIG. 2A, and passes the output signal of the amplitude-modulator 2 of the frequency band shown by the figure g.

The first PLL frequency-synthesizer 4 outputs a signal of a frequency being higher than the oscillation frequency of the oscillator 1 and ranging from 640.5 MHz to 778.5 MHz. The first control circuit 5 is for controlling the oscillation frequency of the PLL frequency synthesizer 4. The frequency converter 6 multiplies the output signal of the first PLL frequency synthesizer 4 and the output signal of the VSBF 3 The filter 7 is a low pass filter with a cut-off frequency of 300 MHz, and passes the low band of the output signal of the frequency converter 6. The amplifier 8 is for amplifying the output signal of the filter 7.

The operation of the video signal transmission equipment of the first embodiment configured above will be described.

The amplitude-modulator 2 amplitude-modulates the output signal of the oscillator 1 shown by a line b of FIG. 2 by the video baseband signal of a frequency band shown by a figure a. Then, a signal of a frequency band shown by a figure c of FIG. 2C is generated.

The output signal of the amplitude-modulator 2 is filtered by the band pass filter VSBF 3 so that the frequency components of the lower sideband and a part of the upper sideband are passed, and a vestigial sideband modulated wave is generated which has a video carrier frequency of 483.25 MHz and a frequency band shown by a figure d of FIG. 2B. For example, when a signal of 157.25 MHz, one of video signals of 24 channels, is transmitted the first PLL frequency synthesizer 4 is controlled by the first control circuit 5 so as to output a sinusoidal signal of a frequency of 640.5 MHz (line e of FIG. 2B). Then, the vestigial sideband modulated wave is frequency-converted by multiplying the output signal of the VSBF 3 and the output signal of the first PLL frequency synthesizer 4 by the frequency converter 6. As a consequence, the following modulated waves are generated: a modulated wave of a vestigial sideband of a video carrier frequency of 157.25 MHz (a frequency band shown by a figure f1 of FIG. 2B); and a modulated wave of a vestigial sideband of a video carrier frequency of 1123.75 MHz (a frequency band shown by a figure f2 of FIG. 2B).

Since the filter 7 passes only the frequency components, of 300 MHz or lower, of the output signal of the frequency converter 6, only the vestigial sideband modulated wave of a carrier frequency of 157.25 MHz (the frequency band shown by the figure f1 of FIG. 2B) is left. The output signal of the filter 7 is power-amplified by the amplifier 8, and is transmitted as the video signal 8A. Likewise, in order to obtain an arbitrary one of video signals of 24 channels in the range of 157.25 MHz to 295.25 MHz, the oscillation frequency of the first PLL frequency synthesizer 4 is changed at intervals of 6 MHz in the range of 640.5 MHz to 778.5 MHz. The first control circuit 5 controls the change of the oscillation frequency of the first PLL frequency synthesizer 4.

By providing the configuration of FIG. 1, video signal transmission equipment can be realized which is capable of transmitting video signals of a total of 24 channels at intervals of 6 MHz in the frequency range of 157.25 MHz to 295.25 MHz without changing the circuit or replacing a part.

In the video signal transmission equipment of FIG. 1, the first PLL frequency synthesizer 4 incorporates a non-illustrated clock oscillator, and a reference clock signal is oscillated by the clock oscillator. The reference clock signal serves as a reference for the operation of the video signal transmission equipment. During normal operation, the output signal of the first PLL frequency synthesizer 4 is in synchronism with the reference clock signal. When the output signal of the first PLL frequency synthesizer 4 and the reference clock signal are unlocked, the video signal is not transmitted at the frequency of a desired channel, and the video signal is transmitted at a different frequency. In a wire system or a wireless system using frequency division multiplex, when a signal is transmitted at a frequency other than the frequency of a predetermined channel, the signal may interfere with other channels. The subsequently-described second embodiment is intended to improve the video signal transmission equipment in that point and to prevent the interference with other channels even when the first PLL frequency synthesizer 4 is unlocked.

Second Embodiment

Video signal transmission equipment in the second embodiment of the present invention will be described with reference to FIG. 3.

Figure 3:
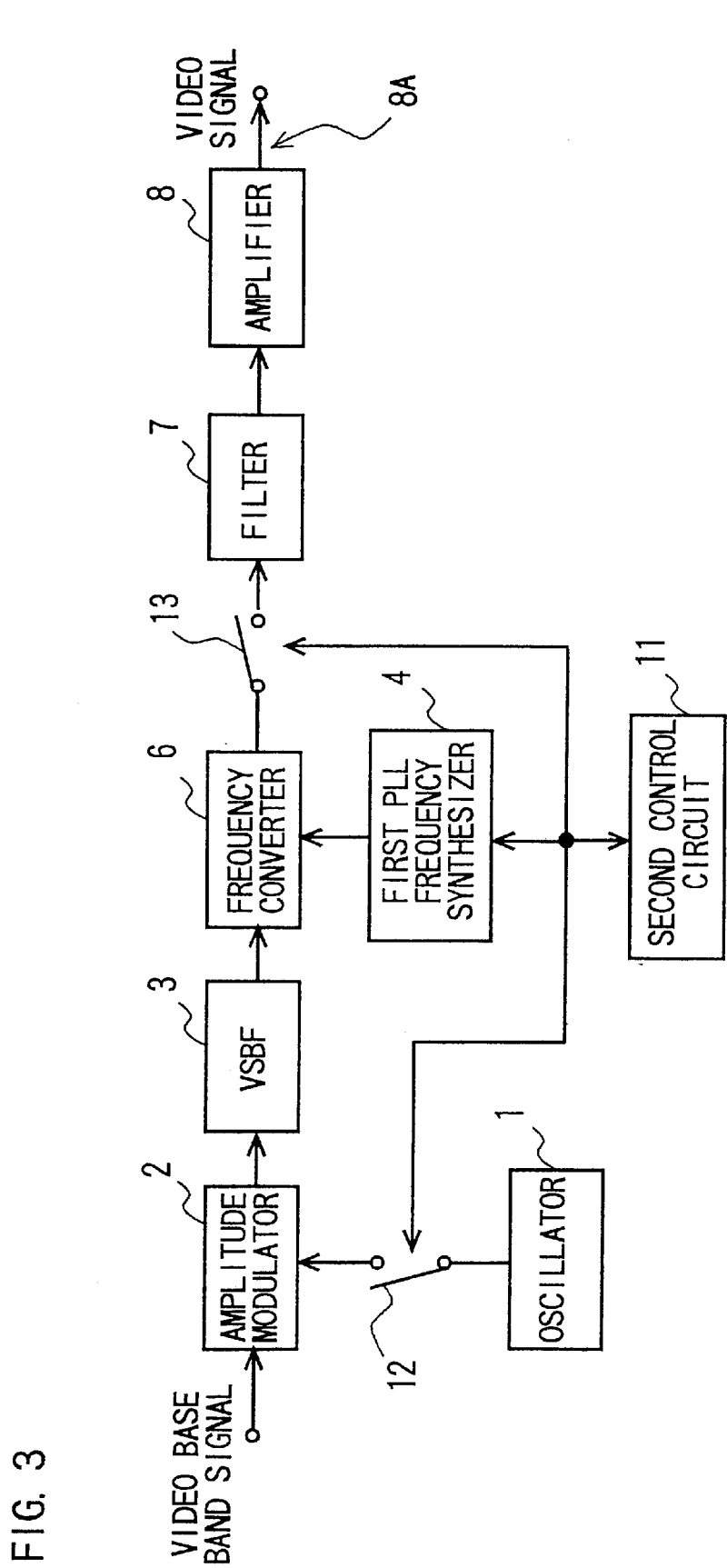
FIG. 3 is a block diagram showing the configuration of video signal transmission equipment of a second embodiment of the present invention.

FIG. 3 is a block diagram showing the configuration of the video signal transmission equipment in the second embodiment of the present invention. In FIG. 3, the video signal transmission equipment comprises an oscillator 1, an amplitude-modulator 2, a VSBF 3, a first PLL frequency synthesizer 4, a frequency converter 6, a filter 7 and an amplifier 8 which are similar to those shown in FIG. 1. The first control circuit 5 of FIG. 1 is replaced with a second control circuit 11. In FIG. 3, a first switch 12 is further provided between the oscillator 1 and the amplitude-modulator 2. Moreover, a second switch 13 is provided between the frequency converter 6 and the filter 7.

The first switch 12 connects or disconnects the signal transmission path between the oscillator 1 and the amplitude-modulator 2. The second switch 13 connects or disconnects the signal transmission path between the frequency converter 6 and the filter 7. The second control circuit 11 controls the oscillation frequency of the first PLL frequency synthesizer 4, and detects the condition of synchronism between the output signal of the first PLL frequency synthesizer 4 and the reference clock signal. The second control circuit 11 controls the closing and opening of the first switch 12 and the second switch 13. The elements which are the same as the elements of FIG. 1 have the same reference numerals, and no overlapping description will be given because the descriptions of the first embodiment are applicable.

The operation of the video signal transmission equipment configured above will be described.

The process of generating the video signal 8A in the video signal transmission equipment of FIG. 3 will not be described because it is similar to the process of generating the video signal 8A in the video signal transmission equipment of FIG. 1.

Hereafter, the operation will be described with respect to each of the case where the output signal of the first PLL frequency synthesizer 4 and the reference clock are locked with each other and the case where they are unlocked.

The condition of lock between the output signal of the first PLL frequency synthesizer 4 and the reference clock signal is detected by the second control circuit 11. When the output signal of the first PLL frequency synthesizer 4 and the reference clock signal are locked with each other, the second control circuit 11 controls the first switch 12 and the second switch 13 so as to be closed. As a result, the video signal 8A is transmitted from the amplifier 8 on a desired channel.

When the output signal of the first PLL frequency synthesizer 4 and the reference clock signal are unlocked, the second control circuit 11 controls the first switch 12 and the second switch 13 so as to be opened. In this case, the first switch 12 and the second switch 13 may be controlled so that either one of them is opened. As a result, the video signal 8A is not transmitted from the amplifier 8.

In the second embodiment, the attenuation factor may be varied based on a control signal from the second control circuit 11 by replacing each of the first switch 12 and the second switch 13 with a variable attenuator.

Moreover, the operation of the oscillator 1 may be stopped so that the sinusoidal signal is not input to the amplitude-modulator 2 by replacing the first switch 12 with a switch for turning off the power which is supplied to the oscillator 1.

According to the second embodiment, in addition to the effect described in the first embodiment, the video signal transmission equipment is capable of inhibiting transmission of a video signal of a frequency other than the frequency of a desired channel when the output signal of the first PLL frequency synthesizer 4 and the reference clock signal are unlocked.

In the video signal transmission equipment of FIG. 3, the video signal is not transmitted when the first PLL frequency synthesizer 4 is unlocked. The subsequently-described third embodiment is intended to improve the video signal transmission equipment in this point, and to enable the video signal to be transmitted while preventing the interference with other channels even when the first PLL frequency synthesizer 4 is unlocked.

Third Embodiment

Figure 4:
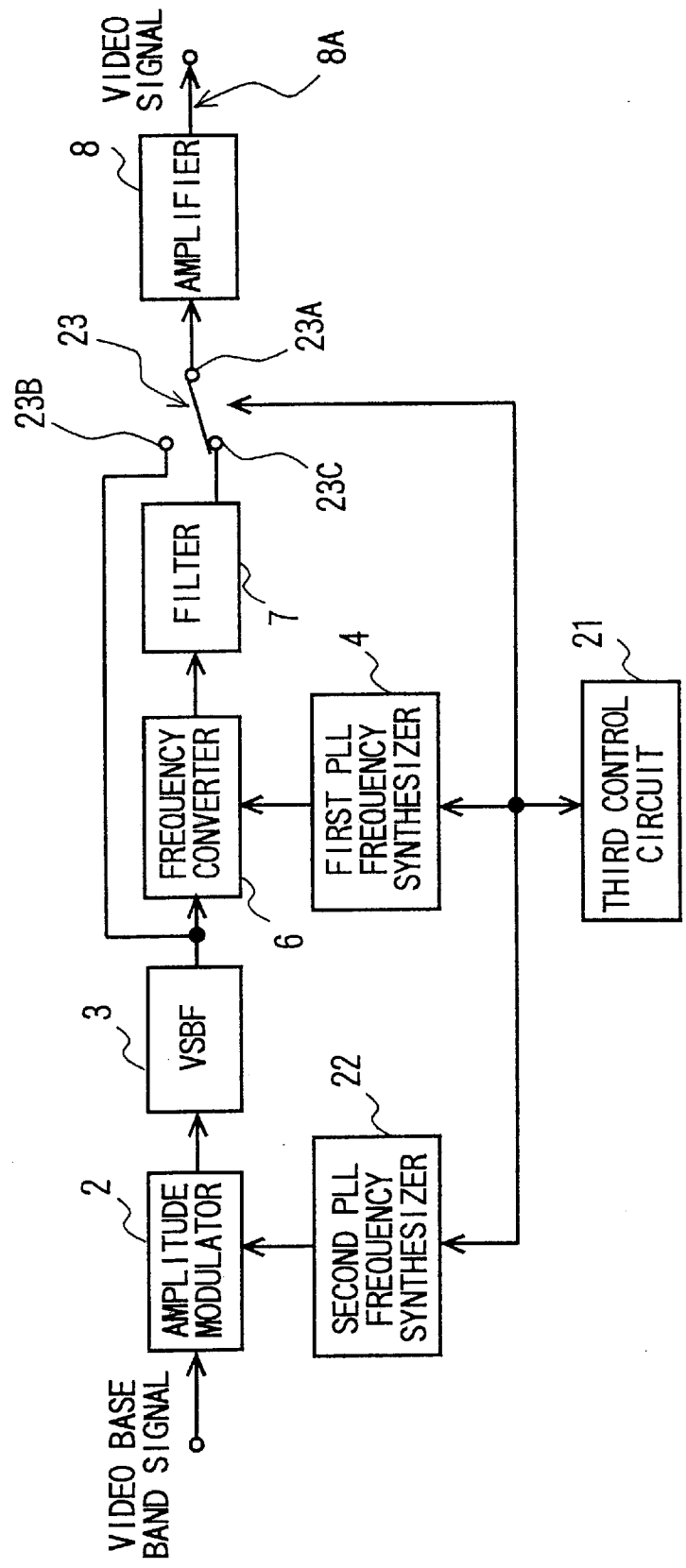
FIG. 4 is a block diagram showing the configuration of video signal transmission equipment of a third embodiment of the present invention.

The video signal transmission equipment in the third embodiment of the present invention will be described with reference to FIG. 4 and FIG. 5. In the video signal transmission equipment as an example in the third embodiment, the video carrier frequency is set at intervals of 6 MHz in the range of 157.25 MHz to 295.25 MHz and video signals of a total of 24 channels can be transmitted. FIG. 4 is a block diagram showing the configuration of the video signal transmission equipment in the third embodiment. FIG. 5 shows an example of the disposition of the frequency bands of principal signals in the third embodiment.

In FIG. 4, the video signal transmission equipment comprises an amplitude-modulator 2, a VSBF 3, a first PLL frequency synthesizer 4, a frequency converter 6, a filter 7 and an amplifier 8 which are similar to those shown in FIG. 1. The VSBF 3 has a frequency characteristic shown by a figure g of FIG. 5A. The first control circuit 5 is replaced with a third control circuit 21. The third control circuit 21 is connected to the first PLL frequency synthesizer 4, and is also connected to a second PLL frequency synthesizer 22. The output terminal of the second PLL frequency synthesizer 22 is connected to the amplitude-modulator 2. A third switch 23 is provided between the filter 7 and the amplifier 8. A common contact 23A of the third switch 23 is connected to the input terminal of the amplifier 8, and two switching contacts 23B and 23C are connected to the output terminal of the VSBF 3 and the output terminal of the filter 7, respectively.

The third switch 23 is controlled by the third control circuit 21, and connects the amplifier 8 to either one of the VSBF 3 and the filter 7. The third control circuit 21 controls the oscillation frequency of each of the first PLL frequency synthesizer 4 and the second PLL frequency synthesizer 22, and detects the condition of lock between the output signal of the first PLL frequency synthesizer 4 and the reference clock signal. The second PLL frequency synthesizer 22 outputs a sinusoidal signal of a frequency which is set through the control by the third control circuit 21. The elements which are the same as the elements of FIG. 1 have the same reference numerals, and no overlapping description will be given because the descriptions of the first embodiment are applicable.

The operation of the video signal transmission equipment of the third embodiment configured as described above will be described.

Figure 5A:
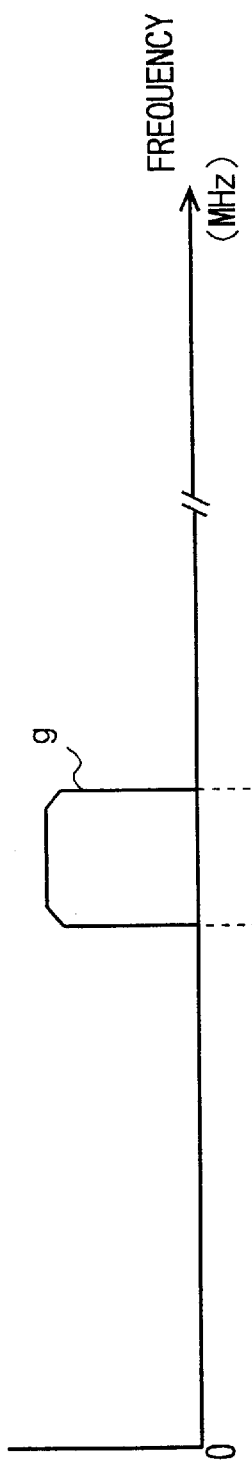
FIG. 5A, FIG. 5B and FIG. 5C are views showing the frequency band of each signal for explaining the operation in the video signal transmission equipment of FIG. 4.
Figure 5B:
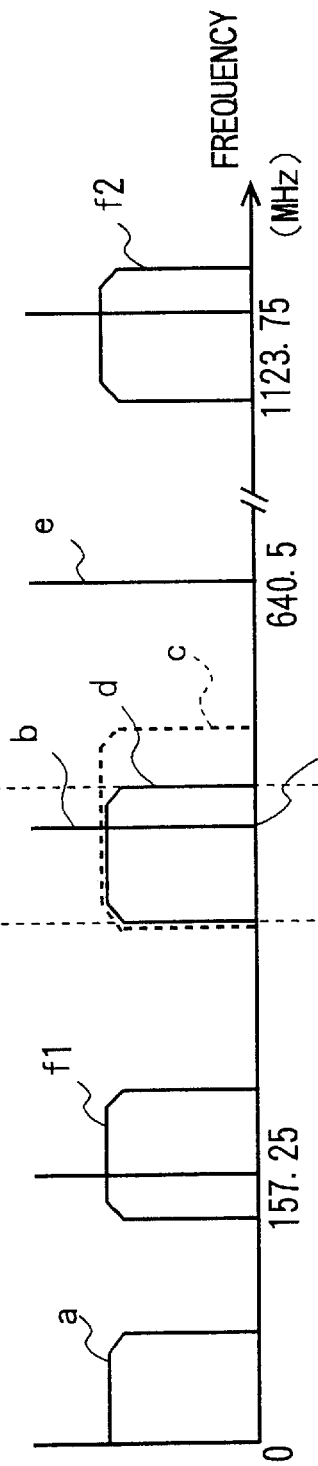
Figure 5C:
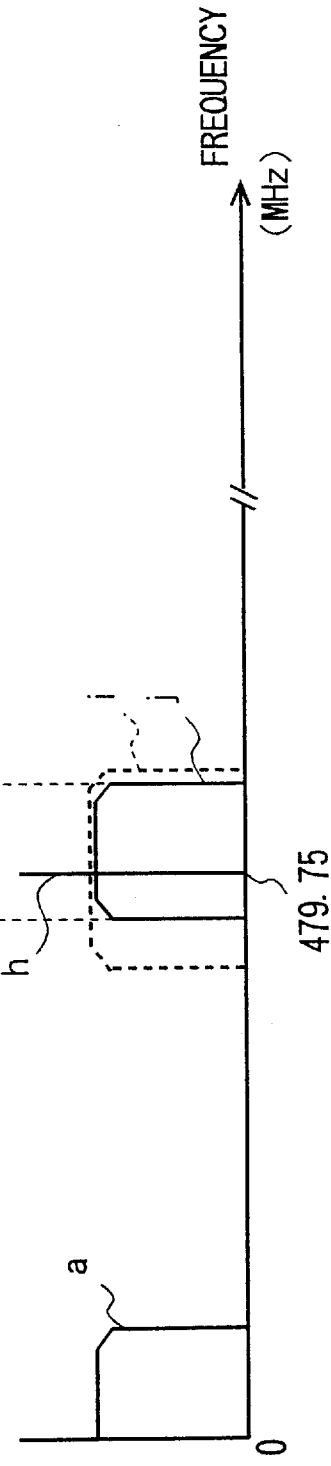
Figure 6:
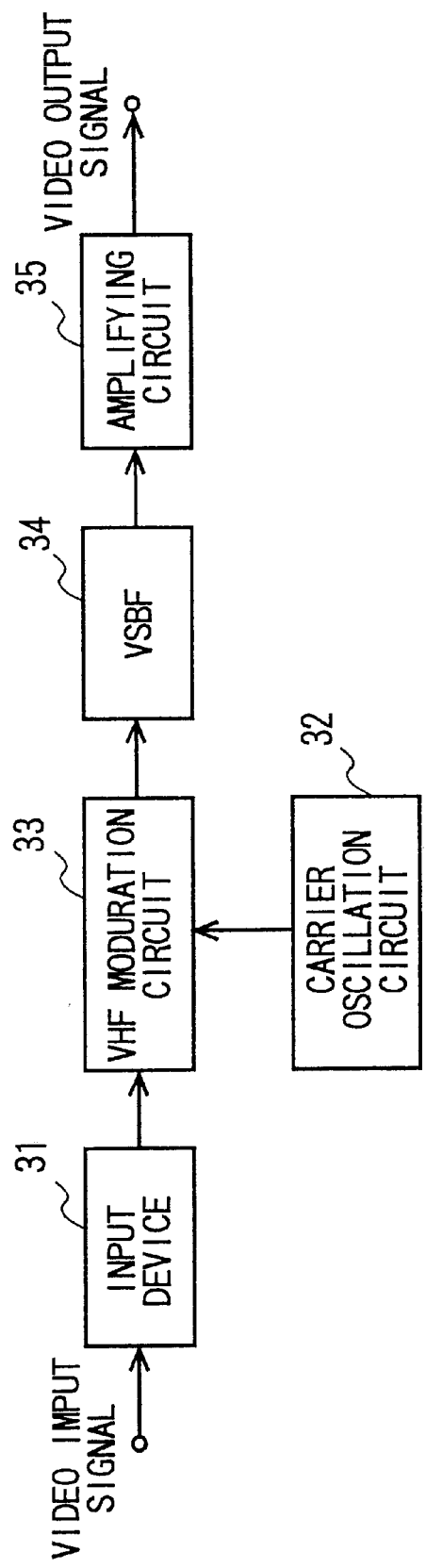
FIG. 6 is the block diagram showing the configuration of conventional video signal transmission equipment.
Figure 7:
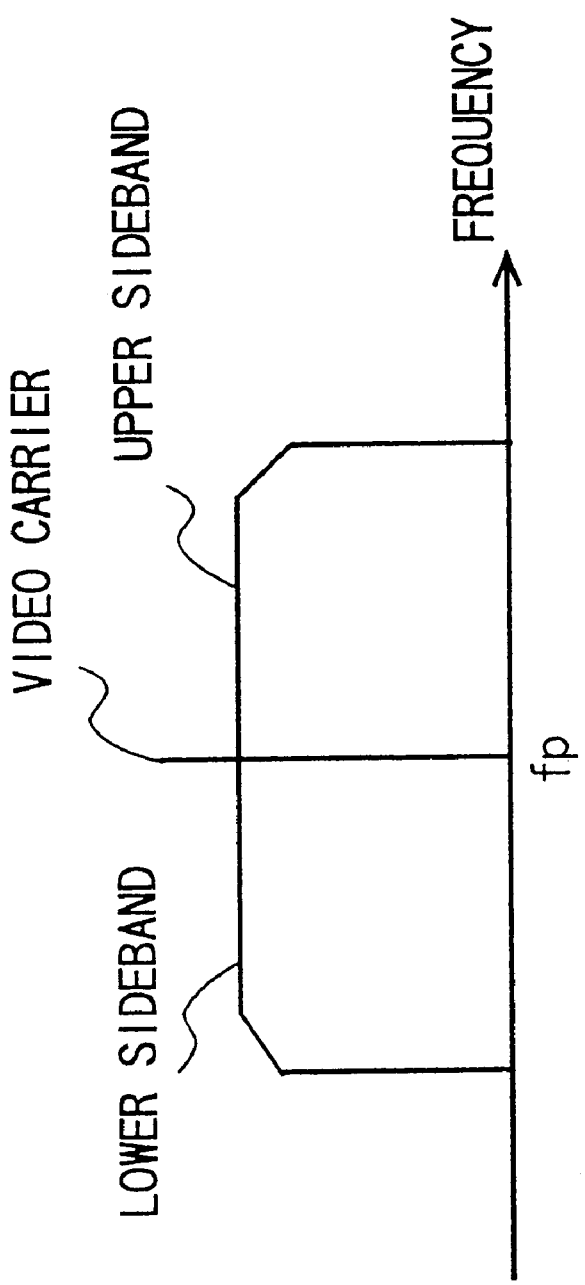
FIG. 7 shows the frequency characteristic of the input signal of the conventional VHF surface acoustic wave filter for vestigial sideband filtering (VSBF)
Figure 8:
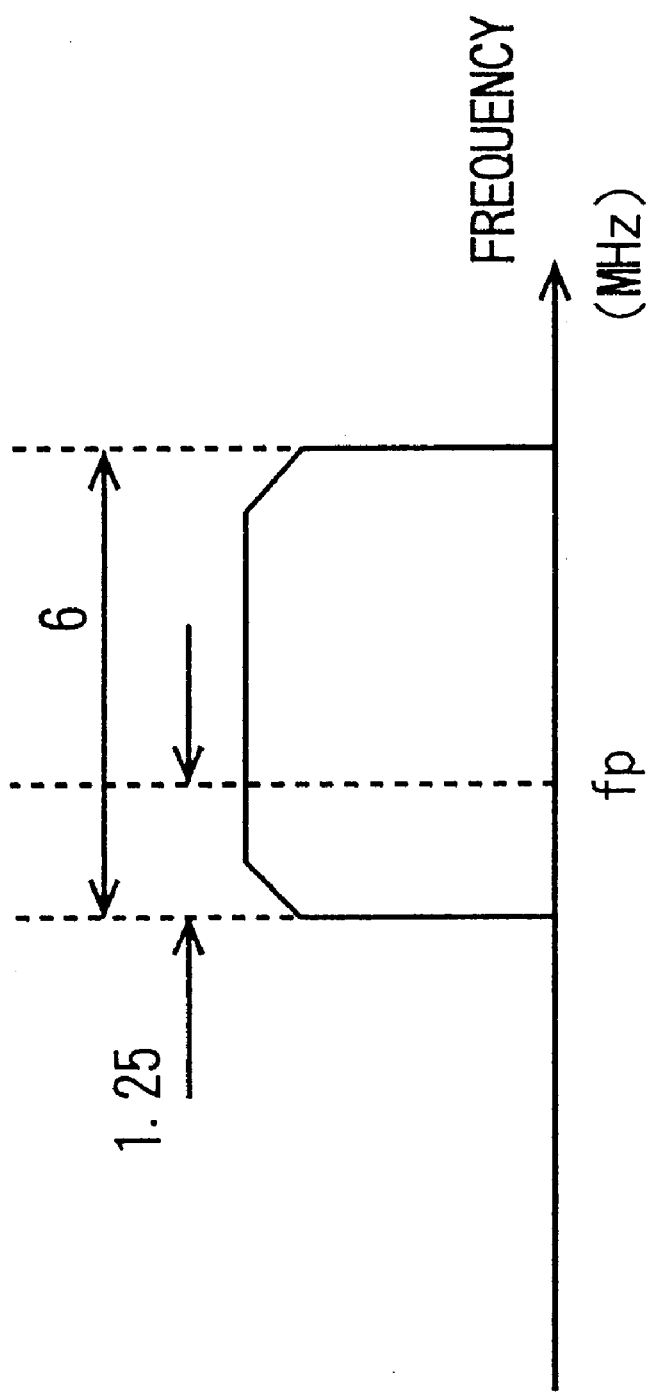
FIG. 8 shows a frequency characteristic of the conventional VSBF.
Figure 9:
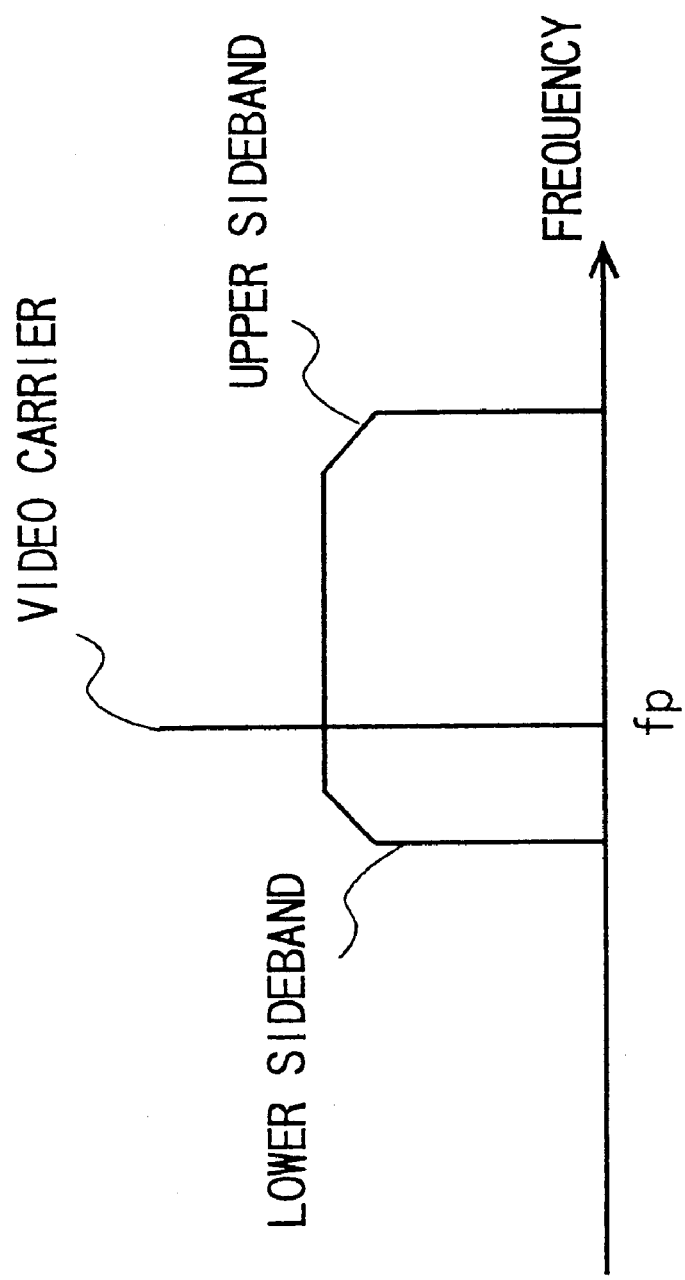
FIG. 9 shows a frequency characteristic of the output signal of the conventional VSBF.

The second PLL frequency synthesizer 22 outputs a sinusoidal signal of a frequency of, for example, 483.25 MHz which is shown by a line b of FIG. 5B and is set through the control by the third control circuit 21. The condition of lock between the output signal of the first PLL frequency synthesizer 4 and the reference clock signal is detected by the third control circuit 21. When the output signal of the first PLL frequency synthesizer 4 is locked with the reference clock signal, the third control circuit 21 controls the third switch 23 so that the output terminal of the filter 7 and the input terminal of the amplifier 8 are connected. As a result, the video signal 8A is transmitted from the amplifier 8 on a desired channel. For example, when the first PLL frequency synthesizer 4 outputs a sinusoidal signal of a frequency of 640.5 MHz shown by a line e of FIG. 5B, a vestigial sideband modulated wave is obtained which has a video carrier frequency of 157.25 MHz in the frequency band shown by a figure f1. The process of generating the video signal 8A will not be described because it is similar to the process of generating the video signal in the video signal transmission equipment of FIG. 1.

When the output signal of the first PLL frequency synthesizer 4 and the reference clock signal are unlocked, the third control circuit 21 controls the third switch 23 so that the output terminal of the VSBF 3 and the input terminal of the amplifier 8 are connected. The second PLL frequency synthesizer 22 is controlled by the third control circuit 21, and outputs a sinusoidal signal of a frequency of, for example, 479.75 MHz which is shown by a line h of FIG. 5C, which is lower by 3.5 MHz than the frequency when the first PLL frequency synthesizer 4 is locked. The amplitude-modulator 2 amplitude-modulates the output signal of the second PLL frequency synthesizer 22 by the video baseband signal of a frequency band shown by a figure a of FIG. 5C, and generates a signal of a frequency band shown by a figure i The output signal of the amplitude-modulator 2 is filtered by the band pass filter VSBF 3 so that the frequency components of the upper sideband and a part of the lower sideband are passed, and a vestigial sideband modulated wave is generated which has a video carrier frequency of 479.75 MHz and a frequency band shown by a figure j of FIG. 5C. The frequency band shown by the figure j is an auxiliary channel. The output of the VSBF 3 is power-amplified by the amplifier 8, and is transmitted as the video signal 8A.

As described above, according to the video signal transmission equipment of the third embodiment, in addition to the effect described in the first embodiment, the video signal can be transmitted on the auxiliary channel even when the output signal of the first PLL frequency synthesizer 4 and the reference clock signal are unlocked.

In the third embodiment, when the first PLL frequency synthesizer 4 is unlocked, the second PLL frequency synthesizer 22 outputs a sinusoidal signal of a frequency which is lower by 3.5 MHz than the frequency in the state of lock to the reference clock signal. However, the frequency is not necessarily set exactly to this value as long as the characteristics of the vestigial sideband modulated wave are not lost.

Moreover, in the third embodiment, the second PLL frequency synthesizer 22 may be replaced with an arrangement in which switching can be performed between a sinusoidal oscillator of a frequency of 483.25 MHz and a sinusoidal oscillator of a frequency of 479.75 MHz.

Although the video carrier frequency is set at 6 MHz intervals in the range of 157.25 MHz to 295.25 MHz and video signals of a total of 24 channels are transmitted in each of the embodiments, the frequency range and the frequency interval are not necessarily the ones mentioned above. Although the video carrier frequency of the vestigial sideband modulated wave is 483.25 MHz, it is not necessarily set to this value as long as it is higher than the carrier frequency of the video signal output from the video signal transmission equipment. Although the cut-off frequency of the filter 7 as the low pass filter is set to 300 MHz, it is not necessarily set to this value because only the frequency components of a target video signal output from the video signal transmission equipment are necessarily passed.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A video signal transmitter for outputting a vestigial-sideband modulated video signal, comprising:

a first oscillator for outputting a first oscillating signal, said first oscillating signal being of a higher frequency than a carrier frequency of said vestigial-sideband modulated video signal transmitted from said video signal transmitter;

an amplitude modulator for amplitude-modulating the first oscillating signal of said first oscillator by a video baseband signal;

a first filter for filtering an output signal of said amplitude modulator, said first filter having a particular frequency characteristic;

a second oscillator for outputting one of a plurality of selectable channel signals, said plurality of channel signals being of a higher frequency range than an oscillation frequency of said first oscillator;

control means for selecting one of the said plurality of channel signals of said second oscillator for output;

a frequency converter for multiplying the selected one of said plurality of channel signals of said second oscillator and an output signal from said first filter; and a second filter for low-pass-filtering an output signal of said frequency converter.

2. A video signal transmitter for outputting a vestigial-sideband modulated video signal comprising:

a first oscillator for outputting a sinusoidal signal of a higher frequency than a carrier frequency of said video signal which is transmitted from said video signal transmitter;

an amplitude modulator for amplitude-modulating an output signal of said first oscillator by a video baseband signal;

a first filter for filtering an output signal of said amplitude modulator said first filter having a particular frequency characteristic;

a second oscillator for oscillating a signal of a higher frequency range than an oscillation frequency of said first oscillator;

control means for controlling an oscillation frequency of said second oscillator;

a frequency converter for multiplying an output signal of said second oscillator and an output of said first filter;

a second filter for low-pass-filtering an output signal of said frequency converter;

detecting means for detecting a condition of lock between the output signal of said second oscillator and a reference clock signal; and inhibiting means for inhibiting transmission of a video signal from said second filter when the output signal of said second oscillator and the reference clock signal are unlocked.

3. A Video signal transmitter for outputting a vestigial-sideband modulated video signal comprising:

a first oscillator for generating a signal of variable frequency sinusoidal signal of a higher frequency than a carrier frequency of said video signal which is transmitted from said video signal transmitter;

an amplitude modulator for amplitude-modulating an output signal of said first oscillator by a video baseband signal;

a first filter for filtering an output signal of said amplitude modulator said first filter having a particular frequency characteristic;

a second oscillator for oscillating a signal of a higher frequency range than an oscillation frequency of said first oscillator;

control means for controlling an oscillation frequency of said second oscillator;

a frequency converter for multiplying an output signal of said second oscillator and an output of said first filter;

a second filter for low-pass-filtering an output signal of said frequency converter;

detecting means for detecting a condition of lock between the output signal of said second oscillator and a reference clock signal; and switching device for causing the output signal of said first filter to be directly transmitted when said second oscillator is unlocked.

* * * * *